United States Patent [19]

Yamagami et al.

[11] Patent Number: 4,628,594

[45] Date of Patent: Dec. 16, 1986

[54] ELECTRONIC CIRCUIT ELEMENT INSERTION APPARATUS

[75] Inventors: Akio Yamagami, Hirakata; Kazuhiko Narikiyo, Katano, both of Japan

[73] Assignee: Matsushita Electric Industrial Co., Ltd., Osaka, Japan

[21] Appl. No.: 708,580

[22] Filed: Mar. 5, 1985

[30] Foreign Application Priority Data

Mar. 8, 1984 [JP] Japan .................................. 59-44305

[51] Int. Cl.[4] ............................................. B23P 19/00
[52] U.S. Cl. .................................... 29/741; 294/87.22; 294/106; 414/739
[58] Field of Search ............... 29/741, 564.1; 294/106, 294/87.22; 414/623, 736, 739, 759

[56] References Cited

U.S. PATENT DOCUMENTS 4,286,380 9/1981 Blount .................................... 29/741

Primary Examiner—Howard N. Goldberg
Assistant Examiner—P. W. Echols
Attorney, Agent, or Firm—Stevens, Davis, Miller & Mosher

[57] ABSTRACT

A lead clamping apparatus clamps and mounts to an electronic circuit board an electronic element having a plurality of leads which are arranged in two rows and are oriented in the same direction. The apparatus includes a plurality of pairs of clamping members arranged in the same direction as the two rows of leads, a support slidable in a direction perpendicular to the direction of pivotal movement of the clamping members to abut against a desired number of the clamping members, whereby allowing the same to perform a clamping action, a drive source for slidingly driving the support, a piston for opening and closing the clamping members through the support, and a pusher slidable in the same direction as the support and for biasing the electronic element to insert the same into the circuit board. Accordingly, it is possible to selectively use the clamping members, of which number corresponds with that of the leads of the electronic element. If there is a sufficient area in an electronic circuit board to receive an electronic element being mounted, the element can be mounted on the board irrespective of other electronic elements having been previously mounted on the board. Programming of production process, and design of electronic circuit boards can be greatly facilitated by the invention.

5 Claims, 10 Drawing Figures

ELECTRONIC CIRCUIT ELEMENT INSERTION APPARATUS

BACKGROUND OF THE INVENTION

1. Field of the Invention

The present invention relates to a lead clamping apparatus employed when an electronic circuit element, such as a dual in-line package type integrated circuit element, is inserted into a printed board which constitutes an electronic circuit.

2. Description of the Prior Art

A dual in-line package type integrated circuit element (referred to as a "DIP type IC", hereinafter) has a configuration as shown in FIGS. 1A, 1B and 1C. With the recent development of semiconductor technology, DIP type ICs are becoming the nucleus of the various constituent elements of electronic circuits.

First of all, conventional apparatuses for clamping leads which are employed when such DIP type ICs are automatically inserted into an electronic circuit board will be described hereinunder with reference to FIGS. 2 to 5.

The conventional lead clamping apparatuses may be roughly classified into two types, that is, the lead clamping type and the insertion guide type. In the lead clamping type apparatus shown in FIGS. 2 and 3, a DIP type IC 1 is first fed from a parts feeder unit (not shown) and is conveyed and transferred. The DIP type IC 1 then is caught by all of its leads 3 by means of integrated clamping members 2. After the distance between the leads 3 on both sides of the DIP type IC 1 is made to correspond with the distance, between two rows of insertion holes 4, 4 formed in an electronic circuit board 5, the leads 3 are properly positioned directly above their mating insertion holes 4. Thereafter, the DIP type IC 1 is pushed by a piston 6 in such a manner that the leads 3 are respectively inserted into the insertion holes 4.

In the insertion guide type apparatus shown in FIGS. 4 and 5, on the other hand, the DIP type IC 1 having been fed, conveyed and transferred in a manner similar to the above, is suction-held by a piston 7 having a suction surface by the operation of a vacuum device (not shown) and is mounted on the electronic circuit board 5 while insertion guides 8 placed closely to the insertion holes 4 on the board 5 guide the leads 3.

It will be understood from the above that both the lead clamping type apparatus and the insertion guide type apparatus must be capable of clamping and guiding a DIP type IC having a maximum insertable number of leads (6 to 22 pins for 0.3-inch DIP type IC). For this reason, when a DIP type IC having a smaller number of pins is inserted in the electronic circuit board 5, such apparatus always involves an unnecessary area (a dead space).

More specifically, as shown in FIG. 6, even when the electronic circuit board 5 has an area large enough for receiving a DIP type IC to be mounted thereon, surplus portions of catching members of the apparatus which are not used for catching the leads of the DIP type IC may interfere with parts or obstacles which have been previously mounted in the vicinity of an area on the circuit board where the DIP type IC is to be placed, so that it would be impossible to insert the DIP type IC into the circuit board.

When various kinds of electronic elements are to be mounted on one electronic circuit board, however, it is generally necessary to insert electronic elements in the vicinity of DIP type ICs in order to densely mount them on the board. In consequence, it is inevitable that when placing successively mounted elements the catching of the previously positioned members by the apparatus can be prevented of the electronic elements are placed on the board in such an order that the apparatus is prevented from interfering with the existing electronic elements on the board. For this reason, it is not possible to feed DIP type ICs in a predetermined cycle time, which fact leads to variations in the period of time required for insertion of DIP type IC into the board, resulting in troublesome arrangements for the insertion operation, such as preparation of an insertion program, as well as a low degree of freedom in designing the electronic circuit board. Accordingly, the above-described fact has been an obstacle to increases in production efficiency.

If priority is given to the feed of DIP type ICs in a constant cycle time, then it is necessary to insert the DIP type ICs into the circuit board prior to the mounting of other electronic elements, which disadvantageously constitutes a limitation in inserting elements into the electronic circuit board.

SUMMARY OF THE INVENTION

In view of the above-described problems of the prior art, it is a primary object of the present invention to provide a lead clamping apparatus which improves the degree of freedom in designing a manufacturing process and an electronic circuit board, thereby substantially enhancing production efficiency.

According to the invention, there is provided a lead clamping apparatus comprising a plurality of pairs of clamping members disposed on the opposite sides of an electronic element having a plurality of leads arranged in two rows in substantially the same direction, said pairs of clamping members being arranged in facing relationship with said two rows of leads in the same direction as that of said two rows of leads, said each pair of opposing clamping members being capable of opening and closing independently of other pairs of clamping members; a support slidable, in a direction in which said leads are arranged, and for selectively abutting against a predetermined number of said clamping members so that only the clamping members required for the clamping operation can act to clamp the leads of said electronic element; a drive source for slidingly moving said support; means for opening or closing said clamping members through said support; and a pusher slidable in the same direction as said support and for pressing said electronic element to insert the same into an electronic circuit board. In the present apparatus, it is possible to selectively use the clamping members, of which number corresponds with that of the leads of a DIP type IC. Therefore, if only there is a sufficient area in an electronic circuit board to be occupied by a DIP type IC being mounted, the DIP type IC can be mounted in the area by the present apparatus even when other electronic elements have been mounted around the area on the electronic circuit board. Accordingly, the invention can facilitate programming of production processes and design of electronic circuit boards, and extend the freedom therein.

The above and other objects, features and advantages of the present invention will become clear from the following description of the preferred embodiment thereof, taken in conjunction with the accompanying drawings.

DESCRIPTION OF THE PREFERRED EMBODIMENT

Figure 1A:
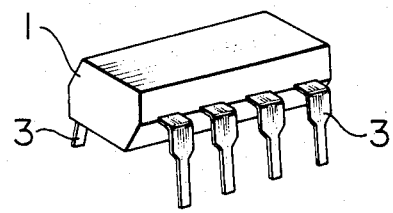
FIGS. 1A, 1B and 1C schematically show a DIP type IC.
Figure 1B:
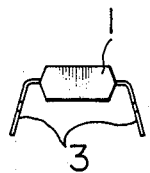
Figure 1C:
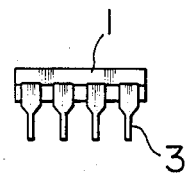
Figure 2:
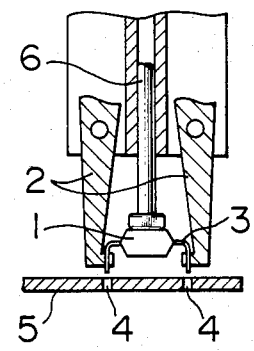
FIG. 2 is a schematic view of a conventional lead clamping type apparatus.
Figure 3:
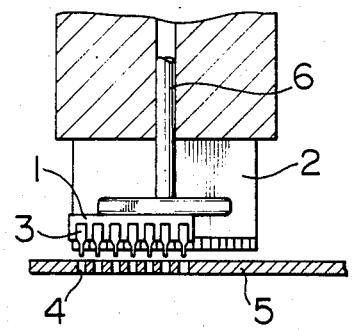
FIG. 3 is a side sectional view of the apparatus shown in FIG. 2.
Figure 4:
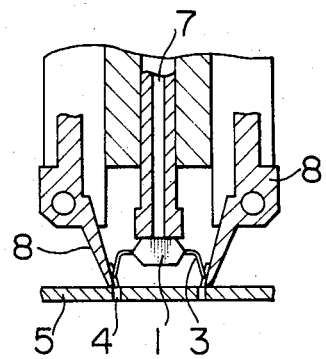
FIG. 4 is a schematic sectional view of a conventional insertion guide type apparatus.
Figure 5:
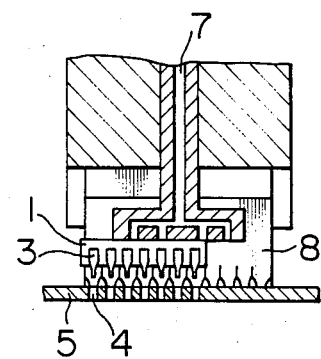
FIG. 5 is a side sectional view of the apparatus shown in FIG. 4.
Figure 6:
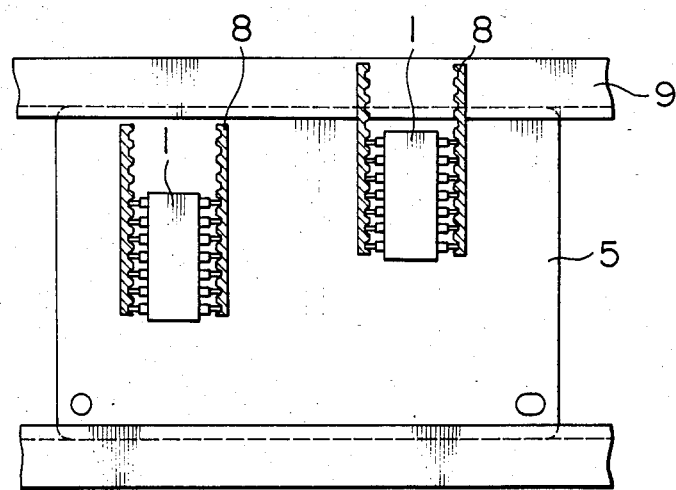
FIG. 6 is a plan view of the apparatus shown in FIG. 4.
Figure 7:
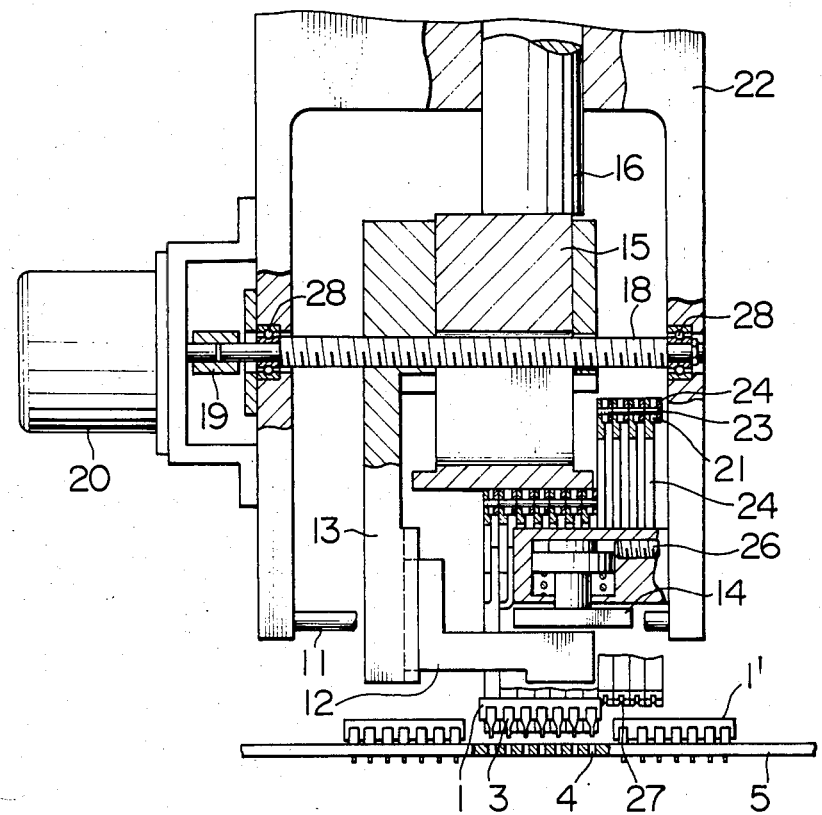
FIG. 7 is a schematic front sectional view of one embodiment of the present invention.
Figure 8:
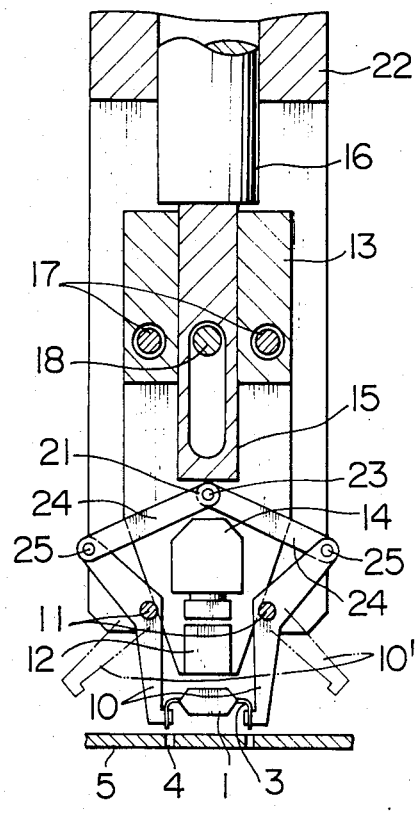
FIG. 8 is a side sectional view of the embodiment shown in FIG. 7.

One embodiment of the present invention will be described hereinunder with reference to FIGS. 7 and 8.

Two sets of clamping members 10 are respectively supported by support pins 11. The number of clamping members 10 in one set is equal to the maximum insertable number of leads. The two sets of opposing clamping members 10 are pivotally connected together by a link mechanism which consists of roller pins 23, links 24 and link pins 25. Each pair of clamping members 10 can be opened and closed independently of other pairs of clamping members. When the clamping members 10 are inoperative, they are maintained in an open state, as shown by reference numeral 10', by the action of springs (not shown). Further, a recess 27 for clamping a lead 3 is formed at the tip end of each clamping member 10 where it abuts against the lead 3, thereby allowing a non-slip stable clamping operation. A pusher 12 acts to push a DIP type IC 1 toward the surface of an electronic circuit board 5, and is vertically movably supported by a slide block 13 to be moved up and down upon the vertical movement of a cylinder 14. When the pusher 12 is inoperative, it is held at a position spaced from the DIP type IC 1 by the action of a spring (not shown). An abutment 15 for opening and closing the clamping members 10 is vertically movably supported by the slide block 13 to be moved up and down upon the vertical movement of a piston 16. When the abutment 15 is inoperative, it is held at a position spaced from the roller pins 23 by the action of a spring (not shown). The slide block 13 is supported by two guide shafts 17 and is actuated so as to slide horizontally, that is, in both the rightward and leftward directions as viewed in FIG. 7, by means of a screw mechanism 18 which is supported on a lifting frame 22 by means of bearings 28, 28. The screw mechanism 18 is directly connected to a drive source 20 through a joint 19.

The following is a description of the operation of the above-described lead clamping apparatus. As the DIP type IC 1 is properly fed, conveyed and transferred, the drive source 20 is actuated in response to a control instruction to rotate the screw mechanism 18, thus causing the slide block 13 to slide horizontally, whereby the abutment 15 and the pusher 12 are moved to a position where the number of clamping members 10 in action corresponds to the number of leads 3 of the DIP type IC 1.

Then, the abutment 15 is pushed downward by the piston 16 to abut against the link rollers 21, thereby causing pivotal movement of the clamping members 10 through the roller pins 23, the links 24 and the link pins 25 to clamp the leads 3 of the DIP type IC 1. Then, the electronic circuit board 5 is moved to a position where the insertion holes 4 thereof are positioned below the DIP type IC 1. Downward movement of the lifting frame 22 positions the DIP type IC 1 at a proper level above the insertion holes 4 of the electronic circuit board 5, and the insertion operation is then started. More specifically, the cylinder 14 is lowered by the pneumatic pressure fed via a port 26, causing the pusher 12 to move downward to abut against the DIP type IC 1 and further to push the same downward, whereby the insertion operation is completed. After the completion of the insertion operation, the abutment 15 is retracted to return the clamping members 10 to their openend positions by the action of the associated springs (not shown). In this case, unnecessary clamping members 10' having not been used do not abut against the abutment 15, and are maintained in their opened positions, so that they do not interfere with the DIP type IC 1' which has been inserted into the electronic circuit board 5.

Conventionally, 0.3-inch DIP type ICs manufactured and adapted to be automatically inserted, have 6 to 22 pins. For insertion of these DIP type ICs into electronic circuit board, in addition to the above system, as shown in the above embodiment, in which the number of clamping members in action is caused to correspond with that of leads of a DIP type IC being inserted, it may be contemplated as an effective measures to set the number of clamping members in a stepwise manner (for example, the use of ten pairs of clamping members for DIP type ICs having 6 to 10 pins, the use of sixteen pairs of clamping members for DIP type ICs having 12 to 16 pins, and the use of twenty-two pairs of clamping members for DIP type ICs having 18 to 22 pins).

As has been described above, according to the present invention, it is possible to select the number of clamping members in action which corresponds with the number of leads of an element to be inserted. Therefore, if only there is an area large enough to cover in an electronic circuit board a DIP type IC being inserted, it is possible to insert the DIP type IC irrespective of whether or not elements have previously been inserted in the electronic circuit board in the vicinity of said area. Accordingly, it is possible to simplify the preparation of an insertion program, to eliminate variations in the period of time required for insertion and to substantially improve the operating efficiency. Thus, it is possible to increase the production efficiency.

Further, the present invention is advantageous in enlarging the insertable area in an electronic circuit board, mounting electronic elements at a favorably high density, and in designing electronic circuit boards.

What is claimed is:

1. An apparatus for inserting into an electronic circuit board an electronic circuit element having a plurality of leads arranged in two rows in substantially the same direction comprising:
   frame means including a plurality of pairs of opposing clamping members each pair of which can be opened and closed independently of the other pairs of clamping members to come toward and away from each other in the opposite direction;

slide means slidable in the same direction as an axis about which said plurality of pairs of clamping members are opened and closed;

abutment means supported by said slide means for abutting against a pair of clamping members selected from said plurality of pairs of clamping members to cause them to clamp said electronic circuit element;

pusher means for pushing said electronic circuit element, said pusher means being supported by said slide means to be movable both in the same direction as the sliding direction of said abutment means and in a direction perpendicular to said electronic circuit board; and means for driving said pusher means.

2. A lead clamping apparatus comprising:

a plurality of pairs of clamping members disposed on the opposite sides of an electronic element having a plurality of leads arranged in two rows in substantially the same direction, said pairs of clamping members being arranged in facing relationship with said two rows of leads in the same direction as that of said two rows of leads, said each pair of opposing clamping members arranged for opening and closing independently of other pairs of clamping members;

a support slidable in a direction, in which said leads are arranged, by means of a screw mechanism, and to abut against only the clamping members, of which number corresponds with that of said leads, so that only the clamping members required for the clamping operation can act to clamp the leads of said electronic element;

a drive source for driving said screw mechanism to slide said support;

means for opening or closing said clamping members through said support;

a pusher slidable in the same direction as said support to press said electronic element, thereby causing the same to be inserted into an electronic circuit board; and a drive for moving said pusher up and down to cause the same to abut against said electronic element.

3. A lead clamping apparatus as set forth in claim 2, wherein a portion of said each clamping member which abuts against said lead is formed therein with a recess for holding said lead.

4. A lead clamping apparatus comprising:

a plurality of pairs of clamping members disposed on the opposite sides of an electronic element having a plurality of leads arranged in two rows in substantially the same direction, said pairs of clamping members being arranged in facing relationship with said two rows of leads in the same direction as that of said two rows of leads, said each pair of opposing clamping members being arranged for opening and closing independently of other pairs of clamping members;

a support slidable in a direction, in which said leads are arranged, by means of a screw mechanism, for selectively abutting against only the clamping members, of which number corresponds with that of said leads, so that only the clamping members required for the clamping operation can act to clamp the leads of said electronic element;

a drive source for driving said screw mechanism to slide said support;

a piston for opening or closing said clamping members through said support;

a pusher slidable in the same direction as said support to press said electronic element, thereby causing the same to be inserted into an electronic circuit board; and a drive for moving said pusher up and down to cause the same to abut against said electronic element;

said each pair of clamping members being pivotally connected to each other by means of a link mechanism.

5. A lead clamping apparatus as set forth in claim 4, wherein a portion of said each clamping member which abuts against said lead is formed therein with a recess for holding said lead.

* * * * *